(12) United States Patent
Shibatani

(10) Patent No.: US 6,433,461 B1
(45) Date of Patent: Aug. 13, 2002

(54) DRIVING APPARATUS AND METHOD USING ELECTROMECHANICAL CONVERSION ELEMENTS

(75) Inventor: Kazuhiro Shibatani, Sakai (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/964,861

(22) Filed: Sep. 28, 2001

(30) Foreign Application Priority Data

Sep. 29, 2000 (JP) ........................................ 2000-298430

(51) Int. Cl.⁷ ................................................. H02N 2/00
(52) U.S. Cl. ........................................................ 310/317
(58) Field of Search ............................. 310/316.01, 317

(56) References Cited

U.S. PATENT DOCUMENTS

2001/0022486 A1 * 9/2001 Shibatani .................... 310/328

FOREIGN PATENT DOCUMENTS

| JP | 63-110971 | 5/1988 | ............ H02N/2/00 |
| JP | 2-276481 | * 11/1990 | ............ H02N/2/00 |
| JP | 6-78571 | 3/1994 | ............ H02N/2/00 |
| JP | 2000-358387 | * 12/2000 | ............ H02N/2/00 |
| JP | 2001-16879 | 1/2001 | ............ H02N/2/00 |

* cited by examiner

Primary Examiner—Thomas M. Dougherty
(74) Attorney, Agent, or Firm—McDermott, Will & Emery

(57) ABSTRACT

In a truss-type actuator, drive signals that have been subjected to frequency modulation are impressed to the electromechanical conversion elements in order to improve the driving of the actuator. By doing so, stable driving that is not affected by fluctuations in the resonance frequency is enabled without feedback.

14 Claims, 5 Drawing Sheets

DRIVING APPARATUS AND METHOD USING ELECTROMECHANICAL CONVERSION ELEMENTS

This application is based on application No. JP2000-298430 filed in Japan, the contents of which is hereby incorporated by reference.

BACKGROUND OF THE INVENTION

1. Field of the Invention

The present invention relates to an improved driving apparatus and method for driving of a driven member, such as a disk-like rotor that rotates or a slider that moves in a linear fashion. Specifically, it relates to an improved driving apparatus and method using electromechanical conversion elements, and more specifically to a truss-type improved driving apparatus and method using electromechanical conversion elements. More particularly, it relates to a driving apparatus and a driving method for electromechanical conversion elements belonging to an ultrasonic motor or similar mechanism that uses drive signals that have been subjected to frequency modulation using as the central frequency a frequency near the mechanical resonance frequency of the electromechanical conversion element.

2. Description of the Related Art

As a type of ultrasonic motor mentioned above, the motor having the construction shown in FIG. 7 is known. This ultrasonic motor is a truss-type actuator comprising a driving unit 1 and a pressure unit 6. The driving unit 1 comprises two displacement members 2 and 3 that cross each other at a prescribed angle (for example, 90°), a synthesizing member 5 that is made to adhere at the crossing point thereof and a fixing member 4 that is made to adhere to the ends thereof. The pressure unit 6 comprises a coil spring or similar mechanism and presses the fixing member 4 toward the center of the rotor (i.e., in the direction of the arrow A), which comprises a driven member 7.

This ultrasonic motor may be driven based on non-resonance driving, but if resonance driving is used, efficient low-voltage driving is enabled. Therefore, in general, an ultrasonic motor is driven in a resonance mode.

As a driving apparatus that performs resonance driving of an ultrasonic motor, the apparatus shown in FIG. 8 is proposed (Japanese Laid-Open Patent Application 2001-16879, etc.).

This driving apparatus includes two power amplifiers 102 and 103 that amplify the drive signals from the oscillator 101 and drive the displacement members 2 and 3, respectively, a phase converter 104 that is placed between the oscillator 101 and the power amplifier 103, current detectors 105 and 106 that detect the current values drawn to the displacement members 2 and 3 using resistors R, respectively, and a phase difference detector 107 that detects the phase difference based on the output signals from the current detectors 105 and 106. It further includes a resonance frequency detector 108, two switches 109 and 110, and an MPU 111. The switch 109 has two ON/OFF switch members 109a and 109b. The switch 110 has two ON/OFF switch members 110a and 110b. When the ON/OFF switch members 109a and 110a are both ON, the resonance frequency detector 108 detects the phase difference between the output signal (voltage component) of the oscillator 101 and the output signal (current component) of the current detector 105, and where the driving frequency of the oscillator 101 is higher than the resonance frequency that enables resonance driving (at which there should be no phase difference), the resonance frequency detector 108 outputs to the MPU 111 a signal that reduces the driving frequency of the oscillator 101, while where the driving frequency of the oscillator 101 is lower than the resonance frequency, it outputs to the MPU 111 a signal that increases the driving frequency of the oscillator 101. On the other hand, where the ON/OFF switch members 109b and 110b are ON, the resonance frequency detector 108 detects the phase difference based on the output signal (voltage component) of the phase converter 104 and the output signal (current component) of the current detector 106, and where the driving frequency of the oscillator 101 is higher than the resonance frequency of the displacement member, the resonance frequency detector 108 outputs to the MPU 111 a signal that reduces the driving frequency of the oscillator 101, while where the driving frequency of the oscillator 101 is lower than the resonance frequency, it outputs to the MPU 111 a signal that increases the driving frequency of the oscillator 101.

The MPU 111 reduces or increases the driving frequency of the oscillator 101 based on the signal from the resonance frequency detector 108 in order to adjust the driving frequency of the oscillator 101 to a frequency that enables resonance driving. The elliptical locus of the synthesizing member of this driving apparatus depends on the phase difference of the displacement of each displacement member.

In the driving apparatus described above, drive signals are supplied to the two displacement members and both members are driven, but in addition to this scenario, it is also possible to supply a drive signal only to one of the displacement members such that only one displacement member is driven. A method for this type of one displacement member driving has also been proposed.

FIG. 9 is a block diagram showing the proposed one displacement member driving apparatus.

This driving apparatus amplifies the output signal of the oscillator 201 using the power amplifier 202, and the amplified signal therefrom is supplied to the displacement member 2 or 3 via the switch 203. At the same time, the currents drawn to the displacement members 2 and 3 are detected by separate current detectors 205 and 206, respectively, and based on the current phase difference between these two currents, the MPU 211 adjusts the oscillation frequency of the oscillator 201. The locus of the synthesizing member changes depending on the driving frequency.

Incidentally, using the above driving apparatus that drives both displacement members, the resonance frequency of the displacement member changes as the load and/or environment fluctuate, and if the driving frequency is offset from the resonance frequency, the driving characteristics change substantially. Depending on the degree of such offset, the driving apparatus may not be operated or may stop. Therefore, where an ultrasonic motor is driven based on resonance driving, the oscillation status must be fed back to ensure that the driving frequency matches the resonance frequency of each element.

In addition, in the case of the driving apparatus that drives only one displacement member, because locus control is performed by changing the driving frequency based on the phase difference of the currents that are drawn to the elements, the oscillation status of the displacement member must be fed back.

Where the oscillation status of the displacement member is fed back, a feedback circuit is needed.

OBJECTS AND SUMMARY

The present invention was created in view of this situation, and an object thereof is to provide an improved driving apparatus and method for an actuator. Specifically, an object of the present invention is to improve a truss-type driving apparatus and method using electromechanical conversion elements, and more particularly, to provide a driving apparatus that drives electromechanical conversion elements without feedback.

In order to attain this and other objects, according to one aspect of the present invention, the driving apparatus has (i) a base, (ii) multiple displacement members, the base ends of which are fixed to the base and the tip ends of which are combined at one location, said displacement members each generating a prescribed displacement, (iii) a pressure unit that keeps the synthesizing member, at which the tip ends of the displacement members are combined, in pressure contact with the driven member, which comprises the object of driving, (iv) a drive circuit that impresses drive signals to the displacement members, and (v) a controller that controls the drive circuit so that the synthesizing member moves in an elliptical path and the drive force is transmitted to the driven member, wherein the controller drives at least one of the multiple displacement members using a drive signal that has been subjected to frequency modulation.

According to this aspect of the invention, because the displacement member or elements are driven using a drive signal or signals that have been subjected to frequency modulation, it is no longer necessary to match the driving frequency to the resonance frequency regardless whether resonance or non-resonance driving is performed, and the oscillation status of the displacement members need not be fed back. As a result, the circuitry may be simplified and the number of components may be reduced.

In the driving apparatus according to another aspect of the invention, the central frequency of the drive signal that has been subjected to frequency modulation essentially matches the resonance frequency of the displacement member. In addition, the modulation difference of the drive signal is larger than the range of change in the resonance frequency of the displacement member that occurs due to fluctuations in the ambient environment of the displacement member. Moreover, the modulation difference of the drive signal is larger than the range of change in the resonance frequency of the displacement member that occurs due to fluctuations in the load placed on the displacement member.

According to this aspect of the invention, because the drive signal uses as its central frequency a frequency near the resonance frequency, the actuator may be driven based on resonance driving. In addition, because the modulation difference of the drive signal is set to be larger than the range of change in the resonance frequency that occurs due to fluctuations in the load or the environment, even when the resonance frequency changes due to fluctuations in the load or the environment, driving may be performed regardless of such fluctuations.

In the driving apparatus according to another aspect of the invention, the controller controls the speed of the motion of the driven member by changing at least one of (i) the central frequency, (ii) the modulation difference, or (iii) the modulated frequency of the frequency-modulated signal, which is the drive signal.

According to this aspect of the invention, if at least one of the central frequency, the modulation difference or the modulated frequency of the frequency-modulated signal is changed, the proportion of the higher-than-resonance frequency range in the frequency-modulated signal changes, through which the speed of the driven member is controlled. Consequently, low-speed driving, at which an actuator is not particularly effective, is enabled.

According to another aspect of the present invention, the driving apparatus has (i) a base, (ii) multiple displacement members, the base ends of which are fixed to the base and the tip ends of which are combined at one location, said displacement members each generating a prescribed displacement, (iii) a pressure unit that keeps the synthesizing member, at which the tip ends of the displacement members are combined, in pressure contact with the driven member, which comprises the object of driving, (iv) a drive circuit that impresses a drive signal to one of the displacement members, and (v) a controller that causes the synthesizing member to perform an elliptical motion such that the driving force is transmitted to the driven member. Such motion is made to occur through control of the drive circuit such that one of the multiple displacement members is driven using a drive signal that has been subjected to frequency modulation, wherein the controller impresses to the displacement member to be driven a drive signal that has been subjected to frequency modulation and uses as its central frequency a drive frequency at which the current phase difference between the driven displacement member and the following displacement member, which is not directly driven, becomes approximately 90 degrees.

Using this driving apparatus as an actuator, an area exists in which the driven member moves at an essentially constant speed, as shown by the black dots in FIG. 6 (i.e., the area between approximately 79 kHz and 95 kHz), and the drive-enabled area is large. As a result, driving at an essentially constant speed is possible without feedback of the oscillation status of the displacement members.

BRIEF DESCRIPTION OF THE DRAWINGS

These and other objects and features of the present invention will become apparent from the following description of preferred embodiments thereof taken in conjunction with the accompanying drawings, in which.

In the following description, like parts are designated by like reference numbers throughout the several drawings.

DETAILED DESCRIPTION OF THE PREFERRED EMBODIMENTS

An embodiment according to one aspect of the present invention is explained below with reference to the drawings.

First Embodiment

Figure 1:
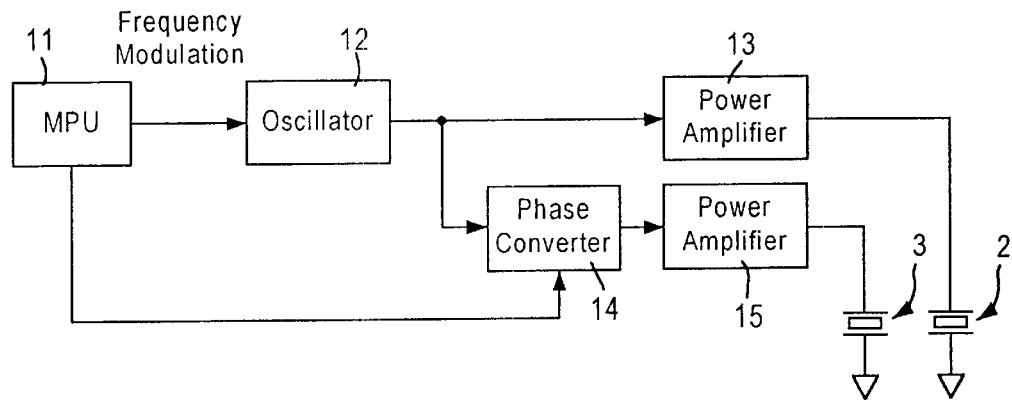
FIG. 1 is a block diagram of a driving apparatus comprising the present invention that is applied in the truss-type actuator shown in FIG. 7, for example, and that drives the actuator based on resonance driving.
Figure 7:
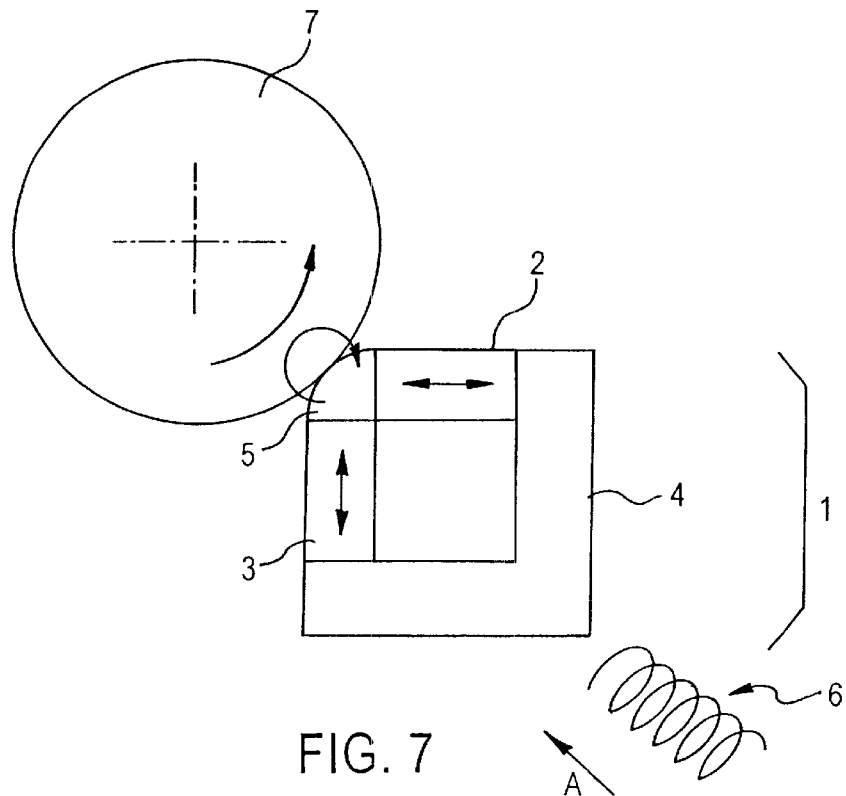
FIG. 7 is a drawing showing one example of the actuator driven by the driving apparatus of the present invention.
Figure 8:
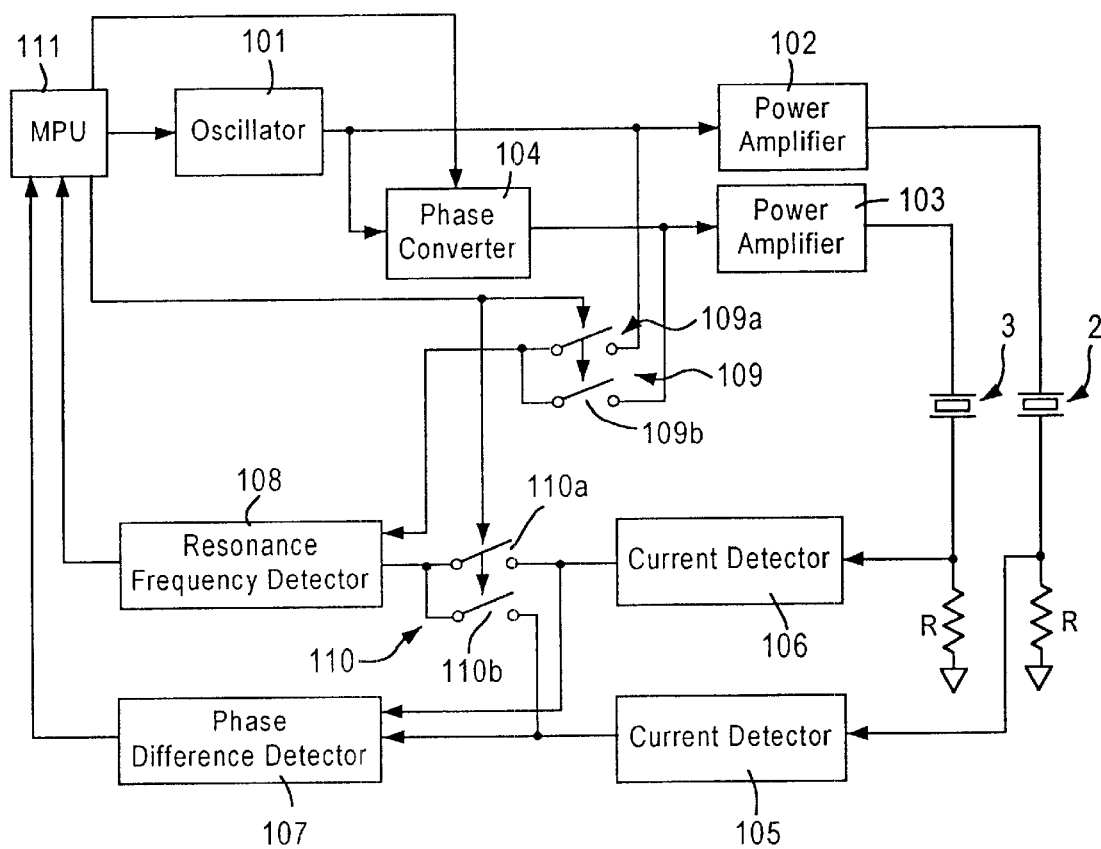
FIG. 8 is a block diagram showing an example of the conventional driving apparatus.
Figure 9:
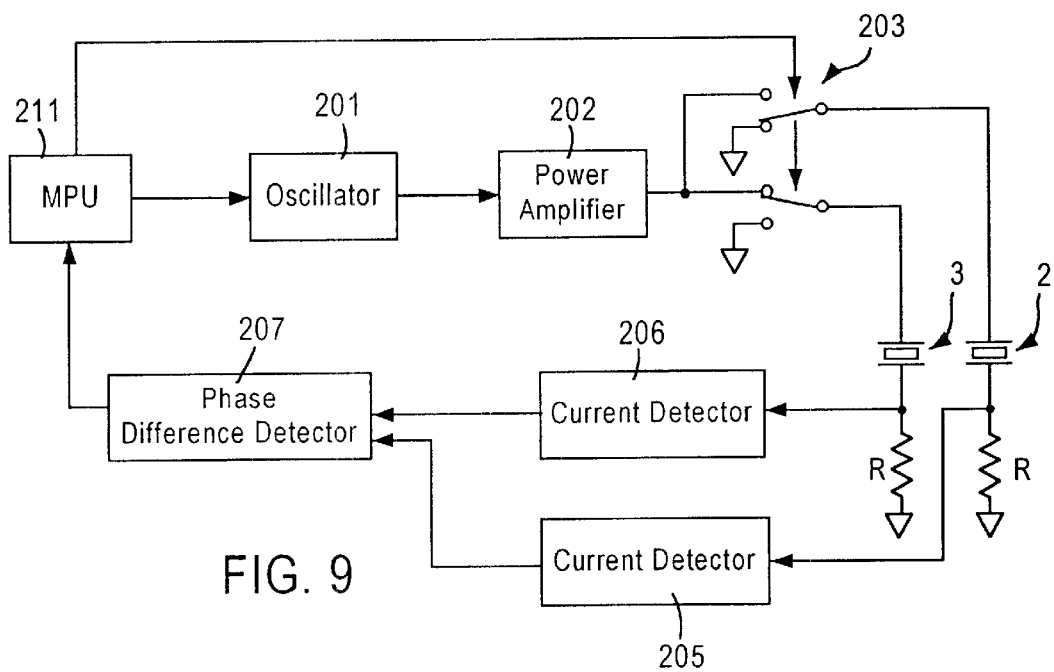
FIG. 9 is a block diagram showing another example of the conventional driving apparatus.

FIG. 1 is a block diagram of a driving apparatus that is applied in the truss-type actuator shown in FIG. 7, for example, and that drives such actuator based on resonance driving.

This driving apparatus supplies drive signals to the displacement members 2 and 3 of the truss-type actuator shown in FIG. 7, and comprises an MPU (microprocessing unit) 11, which functions as a signal generator, an oscillator 12 that performs oscillation based on the output signal from the MPU 11, a power amplifier 13 that inputs the output signal from the oscillator 12 and amplifies it, a phase converter 14 that inputs the output signal from the oscillator 12 and converts it, and a power amplifier 15 that inputs the output signal from the phase converter 14 and amplifies it. The output signal from the power amplifier 13 is supplied to the displacement member 2 of the truss-type actuator. The output signal from the power amplifier 15 is supplied to the displacement member 3 of the truss-type actuator.

Figure 2:
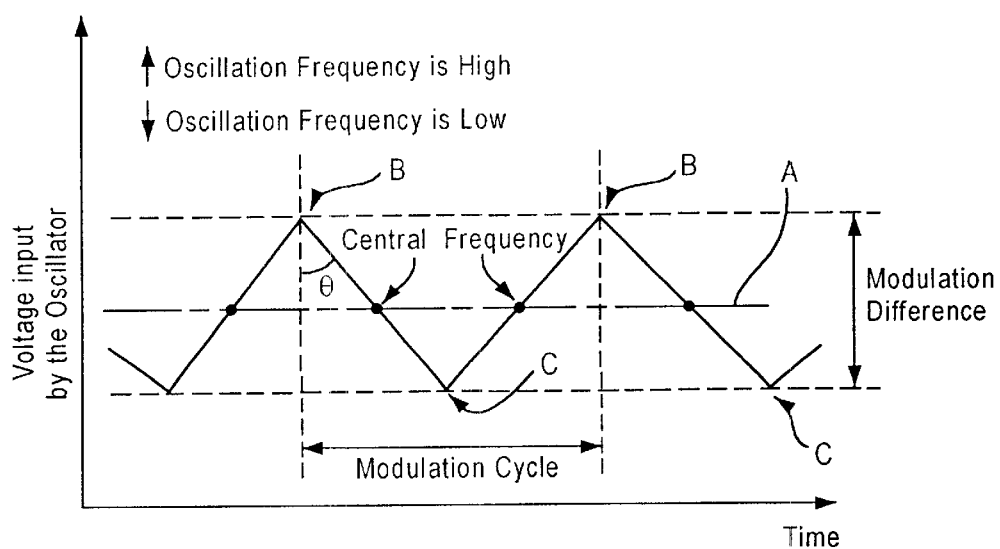
FIG. 2 is a drawing showing an example of the modulation signal used in the present invention.

For the oscillator 12, a voltage-controlled oscillator (Vco) is used in this embodiment. The MPU 11 generates a voltage signal (digital signal) with the triangular-wave frequency modulation function shown in FIG. 2, for example, as a modulation signal, and outputs the signal to the oscillator 12 after D/A conversion. When this is done, if the central voltage A is high, the oscillator 12 outputs modulated waves in which the central frequency of the oscillation frequency is high, and if the central voltage A is low, it outputs modulated waves in which the central frequency of the oscillation frequency is low.

In addition, if the difference between the maximum voltage B and the minimum voltage C is small, the oscillator 12 outputs modulated waves in which the modulation difference of the oscillation frequency is small, and if the difference between the maximum voltage B and the minimum voltage C is large, it outputs modulated waves in which the modulation difference of the oscillation frequency is large.

In addition, if the distance between the adjacent maximum voltage points B or the adjacent minimum voltage points C is narrow, i.e., if the output pitch of the voltage signal to the oscillator 12 is short, the angle θ representing the gradient of voltage change becomes small, and the oscillator 12 outputs modulated waves in which the modulation cycle of the oscillation frequency is short, and if the output pitch of the voltage signal to the oscillator 12 is long, the oscillator 12 outputs modulated waves in which the modulation cycle of the oscillation frequency is long.

In addition, the MPU 11 generates a signal that adjusts the shift amount for the phase converter 14, and outputs the signal to the phase converter 14.

The phase converter 14 adjusts the phase shift of the drive signal received from the oscillator 12 based on the signal from the MPU 11. The power amplifiers 13 and 15 amplify the input signals to prescribed voltages and drive the displacement members 2 and 3 via oscillation. Consequently, the driven member 7 shown in FIG. 7 performs rotational movement, for example. The direction of rotation of the driven member 7 is controlled through the phase adjustment performed by the phase converter 14.

In the driving apparatus having the above construction, the speed of the driven member 7 may be adjusted using the modulated waves described above.

In other words, the rotation speed of the driven member 7 decreases gradually when the driving frequency comprises a frequency higher than the resonance frequency of each displacement member, and rapidly when a frequency lower than the resonance frequency is used, and because the Q value of the mechanical resonation of the actuator is large, the range in which driving is performed using a frequency near the resonance frequency is small. Consequently, if the central frequency of the modulated waves is shifted from the vicinity of the resonance frequency, the average speed of the driven member 7 may be reduced. In addition, depending on the direction in which the central frequency of the modulated waves is shifted, the speed of the driven member 7 may be controlled.

Furthermore, by adjusting the size of the modulation difference, the proportions of the range in which it is easy to drive the actuator (the frequency range in which the driving frequency is higher than the central resonance frequency) and the range in which it is difficult to drive the actuator or in which the actuator is not driven (the frequency range in which the driving frequency is lower than the central resonance frequency) may be changed. Through this characteristic, if the modulation difference is increased, control may be performed such that the speed of the driven member 7 is low.

In addition, by adjusting the size of the modulation cycle (or the modulated frequency), the proportion of the range per unit time in which it is easy to drive the actuator, i.e., more specifically, the proportion of the time in which the resonance frequency exists per unit time, may be changed. Through this characteristic, if the modulation cycle is made short, the speed decreases, so that the speed of the driven member 7 may be controlled.

Therefore, using the driving apparatus of the first embodiment, by using a drive signal that has been subjected to frequency modulation through the changing of at least one of the central frequency, the modulation difference or the modulation cycle, the speed of the driven member may be controlled. In particular, if the modulation difference is set to be larger than the range of change in the resonance frequency that occurs due to fluctuations in the load or the environment, even if the resonance frequency changes, it is ensured that the drive signal will pass through the resonance frequency. Consequently, such problems that the actuator is not operated or stops due to the causes described above no longer occur, and therefore it is no longer necessary to match the drive frequency to the resonance frequency. Therefore, it is no longer necessary to feed back the oscillation status of the displacement members 2 and 3 as in the conventional art, and as a result, the circuit construction may be simplified, and at the same time, the number of components may be reduced.

Figure 3:
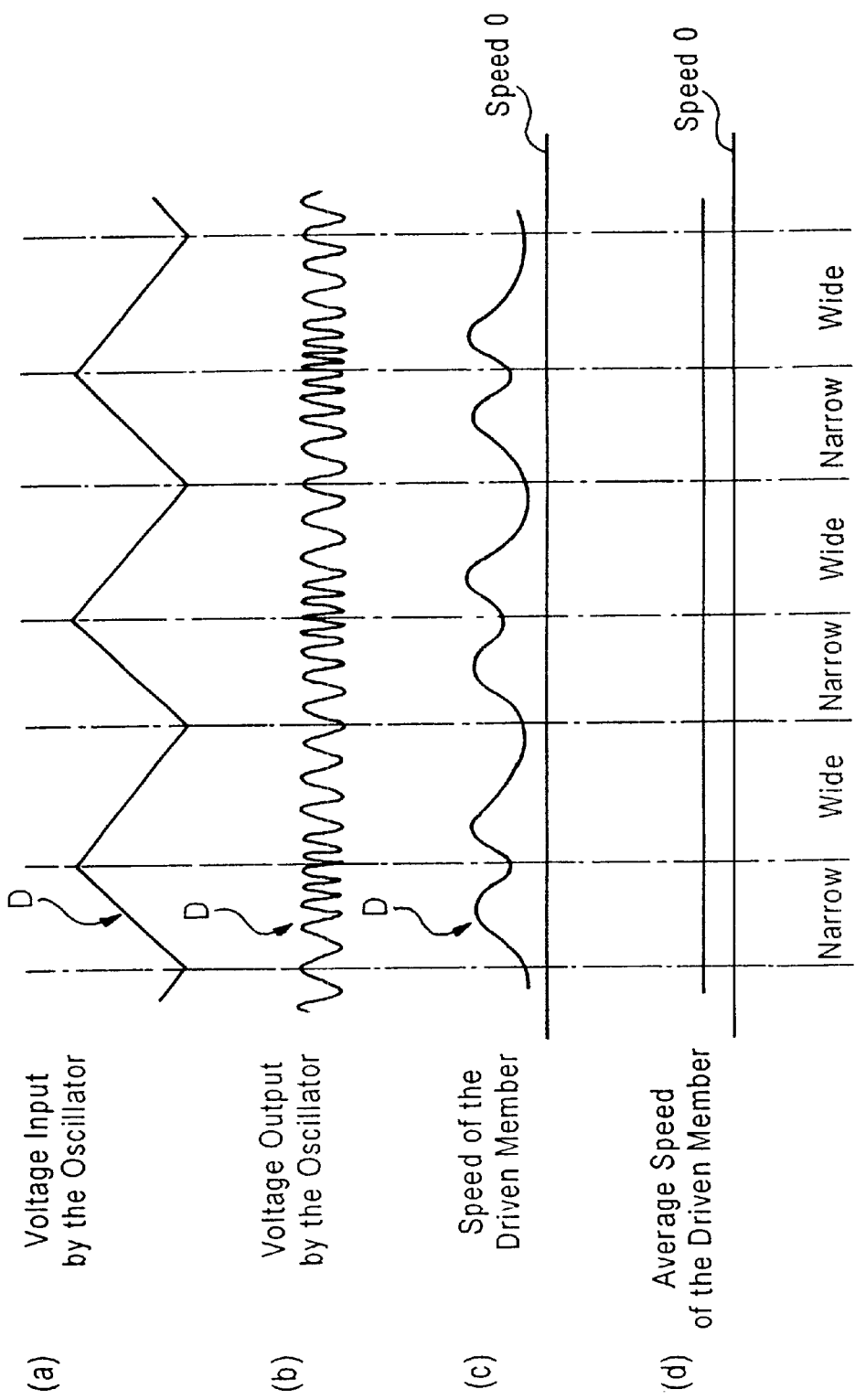
FIG. 3 is a drawing that was obtained when the central frequency of the modulated waves was set close to the resonance frequency and the modulation cycle was adjusted appropriately in accordance with the present invention.

FIG. 3 is a drawing that was obtained when the central frequency of the modulated waves was set near the resonance frequency and the modulation cycle was appropriately adjusted. FIG. 3(a) shows the voltage input by the oscillator, FIG. 3(b) shows the voltage output by the oscillator, FIG. 3(c) shows the speed of the driven member, and FIG. 3(d) shows the average speed of the driven member. D in the drawing indicates a point at which driving was performed using the resonance frequency.

As can be understood from this drawing, the drive signal shown in FIG. 3(b), which was subjected to frequency modulation, is output from the oscillator in response to the input voltage shown in FIG. 3(a), and over a short period of time, the speed of the driven member increases near the resonance frequency and decreases otherwise (see FIG. 3(c)). By adjusting the modulation cycle appropriately, as described above, over a long period of time, the average speed of the driven member 7 may be made essentially constant (see FIG. 3(d)). Therefore, when driving is performed based on such frequency modulation, while the speed drops relative to resonance driving, low-speed driving, at which an actuator is not particularly effective, is enabled.

Figure 4:
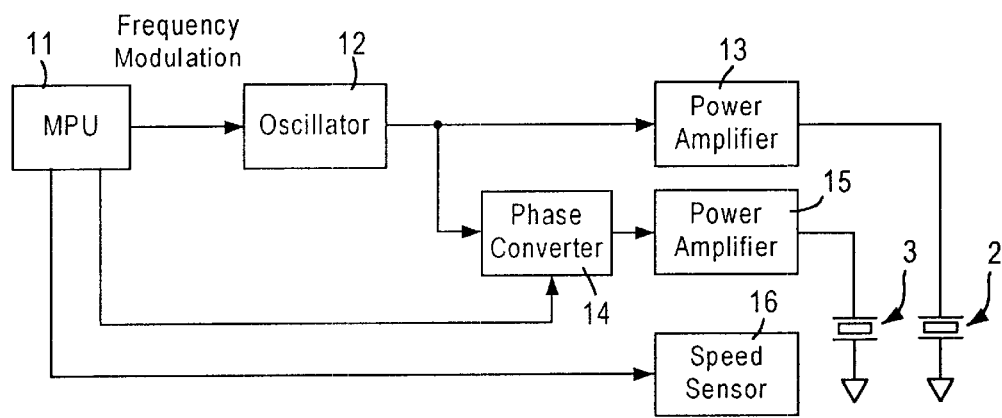
FIG. 4 is a block diagram showing another example of the construction of the driving apparatus pertaining to a first embodiment of the present invention.

It is also acceptable if a speed sensor 16 that detects the rotation speed of the driven member 7 is included, as shown in FIG. 4, such that the output value from the sensor is fed back to the MPU 11. In this case, if the modulation signal for each speed is stored in the memory of the MPU 11 in advance, driving may be performed by the MPU 11 such that the degree of frequency modulation is changed in response to the detected speed, enabling automatic speed adjustment. In this case, it is also acceptable if driving is performed such that a high torque is used during low-speed driving, and a low torque is used during high speed-driving.

Second Embodiment

Figure 5:
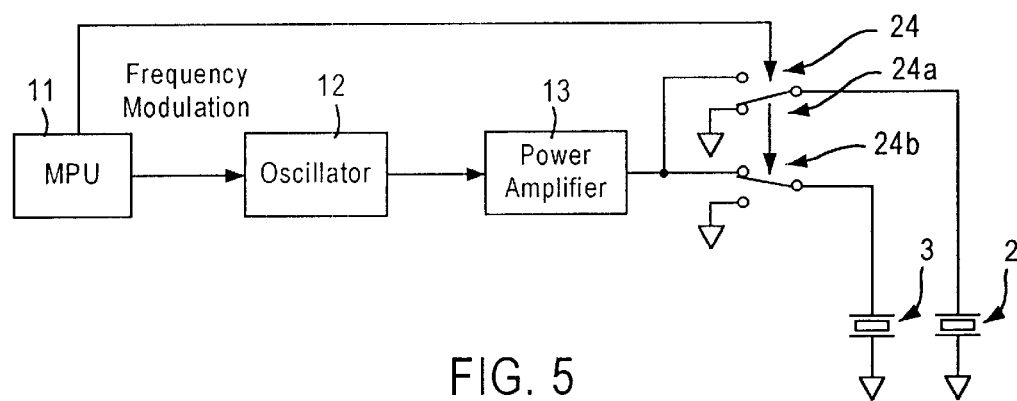
FIG. 5 is a block diagram showing the driving apparatus pertaining to a second embodiment of the present invention.

FIG. 5 is a block diagram of a driving apparatus of the present invention that is applied in a truss-type actuator and that drives one of the displacement members. The same numbers are used for members that perform the same functions described with reference to FIG. 1.

This driving apparatus comprises an MPU 11, an oscillator 12 that performs oscillation based on the output signal from the MPU 11, a power amplifier 13 that inputs the output signal from the oscillator 12 and amplifies it, and a switch 24. The switch 24 comprises a switch member 24a that supplies the drive signal to the displacement member 2 and a switch member 24b that supplies the drive signal to the displacement member 3, and is used to control the method of rotation of the driven member.

The MPU 11 generates a voltage signal (digital signal) with a triangular-wave frequency modulation function as a modulation signal, and outputs the signal to the oscillator 12 after D/A conversion. The oscillator 12 changes at least one of the central frequency, the modulation difference or the modulated frequency of the frequency modulated signal, based on the input signal. In this embodiment, frequency modulation is carried out using the resonance frequency as the central frequency. 'Resonance frequency' as referred to herein is the frequency with which the phase difference between the current drawn to the driving displacement member 2 (or 3) and the current drawn to the following displacement member 3 (or 2) becomes approximately 90 degrees (see Japanese Laid-Open Patent Application 2000-72245).

Therefore, the actuator is driven using a drive signal that has been subjected to frequency modulation in the second embodiment as well, and therefore the same effect obtained in the first embodiment is obtained in the second embodiment.

Figure 6:
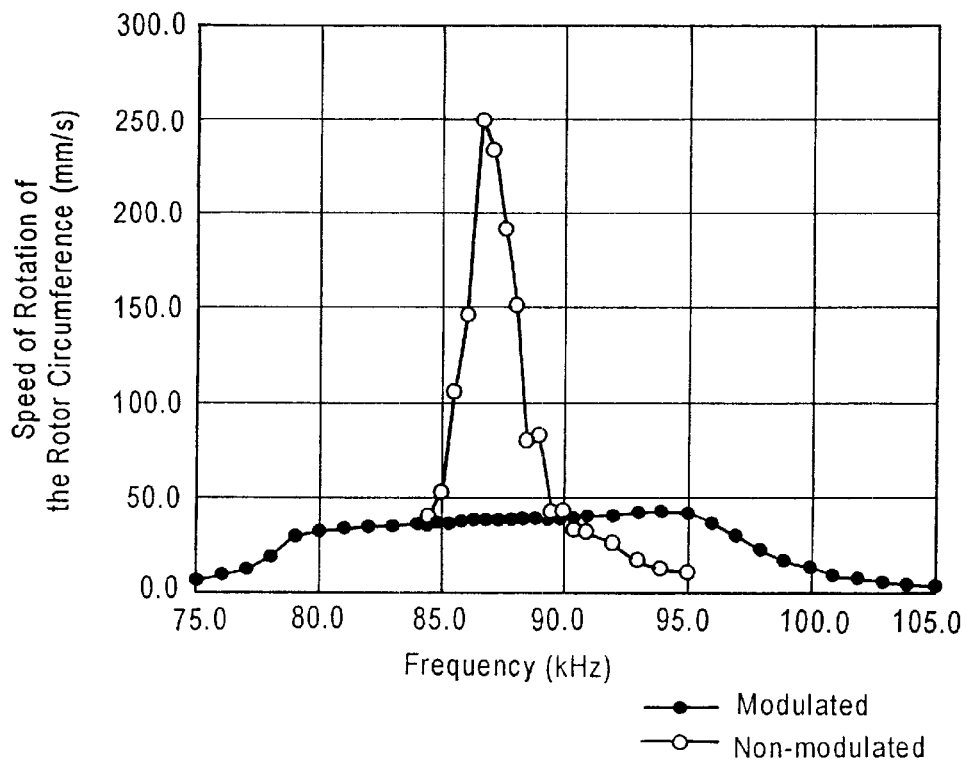
FIG. 6 is a drawing showing the results of experimentation in which the frequency-modulated driving and non-modulated driving using the second embodiment were compared.

FIG. 6 shows the results of experimentation in which frequency-modulated driving (black circles) and non-modulated driving (white circles) using the second embodiment were compared. The horizontal axis shows the value of the central frequency, and the vertical axis shows the speed of rotation of the rotor circumference. The experiment conditions are shown below. For the driven member, a round column-like rotor that had a 30 mm diameter and was Tufftride-treated on the outer surface was used. The pressing force from the pressure unit was 150 gf, the drive voltage was 10 Vp-p (sine waves), the modulation difference was ±10 kHz, the modulated frequency was 30 Hz, the modulation function was a triangular-wave function, and the speed as measured by a velocity sensor was the average speed of the circumference of the rotor.

As can be understood from FIG. 6, when driving was performed without modulation, because the Q value of the mechanical resonance is large, the frequency-speed characteristic comprises a waveform that has sharp peaks. Namely, the point at which the speed becomes the largest is the resonance frequency point, and when the driving frequency moves away from the resonance frequency, the speed suddenly drops, and the driving frequency enters the range in which driving is not enabled. Regarding the speed before and after the resonance frequency is reached, the speed gradually drops in the range in which the frequency is larger than the resonance frequency.

By contrast, with regard to frequency-modulated driving, a range exists in which the rotor rotates at an essentially constant speed (approximately 79 kHz to 95 kHz), although the speed is low, and the range in which driving is possible is larger. In addition, because there is a large range over which the rotor rotates at an essentially constant speed, an essentially constant speed may be maintained with a driving apparatus that does not feed back signals from the displacement members, as in the present invention. From these experimental results, it can be seen that the driving method pertaining to the present invention is effective.

A voltage-controlled oscillator is used for the oscillator in the embodiments described above, but the present invention is not limited to this type of oscillator, and other types of oscillators, such as a direct digital synthesizer (DDS) or a numerically controlled oscillator (NCO), for example, may be used instead.

In addition, in the above embodiments, a truss-type actuator based on phase-difference driving is driven using resonance driving, but the present invention is not limited to this implementation, and may be used in non-resonance driving of a phase-difference drive truss-type actuator. This is because in non-resonance driving, when the synthesizing member is to draw a locus having the same diameters, the speed of the driven member increases as the driving frequency increases, and the present invention may be used to control the speed.

Furthermore, in the above embodiments, the actuator shown in FIG. 7 is driven, but the present invention is not limited to this implementation. The driving apparatus of the present invention may be generally used to drive any actuator that comprises a driving unit comprising (i) a fixing member, (ii) multiple (i.e., three or more) displacement members, which are fixed to the fixing member at the base ends thereof such that they cross each other at the tip ends thereof, and a synthesizing member that is located such that it is in contact with the tip ends of all of the displacement members, and (iii) a pressure unit that keeps the synthesizing unit in pressure contact with the driven member, which is the object of driving.

As explained in detail above, using the present invention, the displacement member or members are driven based on a drive signal or signals that have been subjected to frequency modulation, and therefore regardless whether resonance driving or non-resonance driving is performed, it is no longer necessary to match the driving frequency to the resonance frequency. Consequently, it is not necessary to feed back the oscillation status of the displacement members, and as a result, the circuitry may be simplified and the number of components may be reduced.

Although the present invention has been fully described by way of examples with reference to the accompanying drawings, it is to be noted that various changes and modifications will be apparent to those skilled in the art. Therefore, unless such changes and modification depart from the scope of the present invention, they should be construed as being included therein.

What is claimed is:

1. A driving apparatus comprising:

a base;

multiple displacement members, the base ends of which are fixed to the base and the tip ends of which are combined at one location, said displacement members each generating a prescribed displacement;

a pressure unit that keeps the synthesizing member, at which the tip ends of the displacement members are combined, in pressure contact with the driven member, which comprises the object of driving;

a drive circuit that impresses drive signals to the displacement members, and a controller that controls the drive circuit so that the synthesizing member moves in an elliptical path and the drive force is transmitted to the driven member, wherein the controller drives at least one of the multiple displacement members using a drive signal that has been subjected to frequency modulation.

2. A driving apparatus according to claim 1, wherein the central frequency of the drive signal that has been subjected to frequency modulation essentially matches the resonance frequency of the displacement member.

3. A driving apparatus according to claim 2, wherein the modulation difference of the drive signal is larger than the range of change in the resonance frequency of the displacement member that occurs due to fluctuations in the ambient environment of the displacement member.

4. A driving apparatus according to claim 3, wherein the modulation difference of the drive signal is larger than the range of change in the resonance frequency of the displacement member that occurs due to fluctuations in the load placed on the displacement member.

5. A driving apparatus according to claim 1, wherein the controller controls the speed of the motion of the driven member by changing the central frequency of the frequency-modulated signal, which is the drive signal.

6. A driving apparatus according to claim 1, wherein the controller controls the speed of the motion of the driven member by changing the modulation difference of the frequency-modulated signal, which is the drive signal.

7. A driving apparatus according to claim 1, wherein the controller controls the speed of the motion of the driven member by changing the modulated frequency of the frequency-modulated signal, which is the drive signal.

8. A driving apparatus according to claim 1, wherein the controller drives the multiple displacement members.

9. A driving apparatus comprising:

a base;

multiple displacement members, the base ends of which are fixed to the base and the tip ends of which are combined at one location, said displacement members each generating a prescribed displacement;

a pressure unit that keeps the synthesizing member, at which the tip ends of the displacement members are combined, in pressure contact with the driven member, which comprises the object of driving;

a drive circuit that impresses drive signals to the displacement members, and a controller that controls the drive circuit such that one of the multiple displacement members is driven using a drive signal that has been subjected to frequency modulation, said controller causes the synthesizing member to perform an elliptical motion such that the driving force is transmitted to the driven member.

10. A driving apparatus according to claim 9, wherein the controller impresses to the displacement member to be driven a drive signal that has been subjected to frequency modulation and uses as its central frequency a drive frequency at which the current phase difference between the driven displacement member and the following displacement member, which is not directly driven, becomes approximately 90 degrees.

11. A driving apparatus according to claim 10, wherein the modulation difference of the drive signal is larger than the range of change in the resonance frequency of the displacement member that occurs due to fluctuations in the ambient environment of the displacement member.

12. A driving apparatus according to claim 11, wherein the modulation difference of the drive signal is larger than the range of change in the resonance frequency of the displacement member that occurs due to fluctuations in the load placed on the displacement member.

13. A driving apparatus according to claim 10, wherein the controller controls the speed of the motion of the driven member by changing the modulation difference of the frequency-modulated signal, which is the drive signal.

14. A driving apparatus according to claim 10, wherein the controller controls the speed of the motion of the driven member by changing the modulated frequency of the frequency-modulated signal, which is the drive signal.

* * * * *